US010600808B2

(12) United States Patent
Schröder

(10) Patent No.: US 10,600,808 B2
(45) Date of Patent: Mar. 24, 2020

(54) FERROELECTRIC MEMORY CELL FOR AN INTEGRATED CIRCUIT

(71) Applicant: NaMLab gGmbH, Dresden (DE)

(72) Inventor: Uwe Schröder, Dresden (DE)

(73) Assignee: NaMLab gGmbH, Dresden (DE)

( * ) Notice: Subject to any disclaimer, the term of this patent is extended or adjusted under 35 U.S.C. 154(b) by 0 days.

(21) Appl. No.: 15/695,533

(22) Filed: Sep. 5, 2017

(65) Prior Publication Data

US 2019/0074295 A1 Mar. 7, 2019

(51) Int. Cl.
| | |
|---|---|
| *H01L 29/94* | (2006.01) |
| *H01L 27/11585* | (2017.01) |
| *G11C 11/22* | (2006.01) |
| *H01L 29/66* | (2006.01) |
| *H01L 27/11539* | (2017.01) |
| *H01L 29/51* | (2006.01) |
| *H01L 27/10* | (2006.01) |
| *H01L 49/02* | (2006.01) |
| *H01L 27/11507* | (2017.01) |

(52) U.S. Cl.
CPC ...... *H01L 27/11585* (2013.01); *G11C 11/221* (2013.01); *G11C 11/223* (2013.01); *G11C 11/2273* (2013.01); *G11C 11/2275* (2013.01); *H01L 27/101* (2013.01); *H01L 27/11507* (2013.01); *H01L 27/11539* (2013.01); *H01L 28/40* (2013.01); *H01L 29/516* (2013.01); *H01L 29/6684* (2013.01)

(58) Field of Classification Search
None
See application file for complete search history.

(56) References Cited

U.S. PATENT DOCUMENTS

| | | | | |
|---|---|---|---|---|
| 6,307,731 B1 * | 10/2001 | Katori | ............... | H01L 27/11502 257/295 |
| 6,479,849 B1 * | 11/2002 | Katori | ..................... | H01L 28/55 257/296 |
| 7,871,866 B2 * | 1/2011 | Jeong | .................. | G11O 13/003 257/E47.001 |
| 2002/0149042 A1 * | 10/2002 | Tarui | ................. | H01L 29/40111 257/295 |
| 2005/0230779 A1 * | 10/2005 | Ito | ..................... | H01L 27/10894 257/499 |
| 2007/0131994 A1 * | 6/2007 | Sawasaki | .......... | H01L 27/11502 257/295 |
| 2007/0278545 A1 * | 12/2007 | Kijinna | ............. | H01L 27/11502 257/295 |

(Continued)

OTHER PUBLICATIONS

Mthematica's Element Data (Year: 1999).*

*Primary Examiner* — Ali Naraghi
(74) *Attorney, Agent, or Firm* — Edell, Shapiro & Finnan, LLC

(57) ABSTRACT

An integrated circuit comprises a ferroelectric memory cell including an oxide storage layer, an electrode layer, and an interface layer. The oxide storage layer comprises a ferroelectric material that is at least partially in a ferroelectric state. The ferroelectric material comprises, as main components, oxygen and any of the group consisting of Hf, Zr and (Hf,Zr). The interface layer is disposed between the oxide storage layer and the electrode layer and includes at least one element with a higher valence value than Hf or Zr.

21 Claims, 6 Drawing Sheets

(56) References Cited

U.S. PATENT DOCUMENTS

2009/0127603 A1\* 5/2009 Yamakawa ....... H01L 27/11502
257/295
2015/0340372 A1\* 11/2015 Pandey ............... H01L 27/1159
257/295

\* cited by examiner

FERROELECTRIC MEMORY CELL FOR AN INTEGRATED CIRCUIT

BACKGROUND

A ferroelectric (FE) material is a dielectric crystal that exhibits a spontaneous electric polarization. The direction of spontaneous polarization can be reversed between two crystallographic defined states by application of an external electric field. Ferroelectric materials exhibit ferroelectricity only below the Curie temperature $T_c$, which in literature is also known as the phase transition temperature. Since the phase transition temperature is a material property, its value covers a vast spectrum of temperatures. Above this temperature the material exhibits paraelectric properties and behavior.

The discovery of ferroelectric Hafnium oxide ($HfO_2$) triggered an increase in research on ferroelectric materials, since it was widely recognized that the existence of robust, chemically stable, and relatively inert ferroelectric crystals offered an electrically switchable, two-state device. This electrically switchable two-state possibility by ferroelectric materials has been proposed to be used for different application like memory devices, negative capacity transistors (NCFET), for energy harvesting applications in electro-caloric devices, ferroelectric and pyroelectric sensors and piezoelectric devices, so-called supercapacitors.

Many electronic devices and systems have the capability to store and retrieve information in a memory structure. A number of different memory structures are used in such systems. One prominent volatile memory is a DRAM structure that allows for high speed and high capacity data storage. It is called a volatile memory structure because the stored data is lost within seconds and has to be refreshed in time to secure data storage. Some examples of non-volatile memory structures include read only memory (ROM), EEPROM (electrically erasable programmable read-only memory) and flash memories as an electronic (solid-state) non-volatile computer storage medium that can be electrically erased and reprogrammed. Ferroelectric memory structures (e.g., FeRAM and FeFET devices), phase change memory (e.g., PCRAM) structures, resistive memory (e.g., RRAM) structures and magnetic memory (e.g., MRAM) structures are examples of such non-volatile memory structures.

With regard to ferroelectric (FE) structure, these structures can be in the form of a capacitor (e.g., a FeRAM) or a transistor (FeFET), where information can be stored as a certain polarization state of the ferroelectric material within the structure. The ferroelectric material that can be used is hafnium dioxide or zirconium dioxide or a solid solution of both transition metal oxides. In the case of pure hafnium oxide, the remanent polarization can be improved by a certain amount of dopant species which has to be incorporated into the $HfO_2$ layer during the deposition.

The ferroelectric material is intended to partially or fully replace the gate oxide of a transistor or the dielectric of a capacitor. The switching is caused by applying an electrical field via voltage between transistor gate and transistor channel. Specially, for n-channel transistors, ferroelectric switching after application of a sufficiently high positive voltage pulse causes a shift of the threshold voltage to lower or negative threshold voltage values. For p-channel transistors a negative voltage pulse causes a shift of the threshold voltage to higher or positive threshold voltage values.

One problem that can occur is that charge carriers trapping from one of the electrodes in a capacitor device can shift the polarization hysteresis by creation of an internal bias field due to unequal distribution of charges at the two different electrodes (imprint effect).

Another problem that can occur is that minority carrier trapping from the channel region can shift the threshold voltage of transistors oppositely to the direction caused by ferroelectric switching. Accordingly, it is desirable to avoid charge trapping for a ferroelectric non-volatile memory device. Other negative impacts of trapping are increased leakage current and earlier breakdown of the ferroelectric/interfacial layer causing a reduced lifetime of the ferroelectric transistor or capacitor. In order to do this, the ferroelectric properties of the ferroelectric material must be enhanced to improve the lifetime of the ferroelectric device.

However, even with improvements to the ferroelectric properties, charge trapping within the ferroelectric layer cannot be avoided completely. For example, due to the ability to make $HfO_2$ thin together with a very thin interface layer while still maintaining its ferroelectric properties (low dead layer effect), charge trapping becomes much more critical compared to other ferroelectric materials such as Lead Zirconate Titanate (PZT), Bismuth Titanate (BTO) or Strontium Bismuth Tantalate (SBT). For PZT, BTO or SBT materials, a layer thickness must be about 100 nm combined with a thick interface layer used as barrier which reduces charge trapping in the ferroelectric material or leakages currents significantly.

To improve the sensing and memory window of the device with thin ferroelectric materials, electrical trapping can be avoided by a reduction of defect sites mainly at the interface to the electrodes. It is known that epitaxial growth of layers is a possibility to reduce defect sites at the interface between ferroelectric materials and the electrode. The reduction of defect sites at the interface needs a nearly perfect match of lattice constant between the different materials. Epitaxial growth therefore limits the available materials significantly because a nearly perfect lattice match of the electrode and dielectric lattice is necessary, which limits the used material sets. Additionally, epitaxial growth is a slow and very expensive approach.

SUMMARY

In accordance with embodiments described herein, an integrated circuit comprises a ferroelectric cell. The ferroelectric cell comprises an oxide storage layer, and an oxide interface layer at the interface to the electrodes. The oxide storage layers comprises a ferroelectric material that is at least partially in a ferroelectric state and further comprises, as main components, oxygen and any of the group consisting of Hf, Zr and (Hf, Zr).

The oxide interface layer comprises as main component oxygen and any of the group consisting of Hf, Zf (Hf, Zr) and dopants with a higher valence value than Hf (4+) or Zr (4+), e.g., metals like Nb (5+), Ta (5+), and V (5+)). The metals with higher valence value than Hf (4+) or Zr (4+) have the task to reduce trap sites at defect positions possibly related to oxygen vacancies.

In accordance with other embodiments described herein, the ferroelectric cell comprises an oxide storage layer, and a metal interface layer at the interface between the dielectric layer and the electrodes. The metal interface layer at the interface between the metal electrode and the ferroelectric material containing a metal (e.g., Nb, Ta, and V). The metal atoms with the valence value higher than Hf (4+) or Zr (4+) have the task to reduce trap sites at defect positions possibly related to oxygen vacancies at or in this interface layer.

Tunneling into trap sites is most critical within 1-2 nm depth range from the electrode into the dielectric. Accordingly, to avoid any trap sites within this interfacial range, doping for trap reduction within this range is beneficial.

The amount of dopants needs to be higher than the amount of possible trap sites. By having a higher amount of dopants, a close vicinity of a dopant and a trap sites at an oxygen vacancy is likely. This reduces the amount of trap sites effectively. Since the amount of trap sites within Hf- or Zr-oxide is in the <5% range of oxygen sites, consequently, the amount of dopants needs to be higher. Typically, doping of five-valent dopants need to be in the 10-90% range of cations within the first monolayers next to the two electrodes.

The above and still further features and advantages of embodiments of the present invention will become apparent upon consideration of the following detailed description thereof, particularly when taken in conjunction with the accompanying drawings wherein like reference numerals in the various figures are utilized to designate like components.

DETAILED DESCRIPTION

Figure 1A:
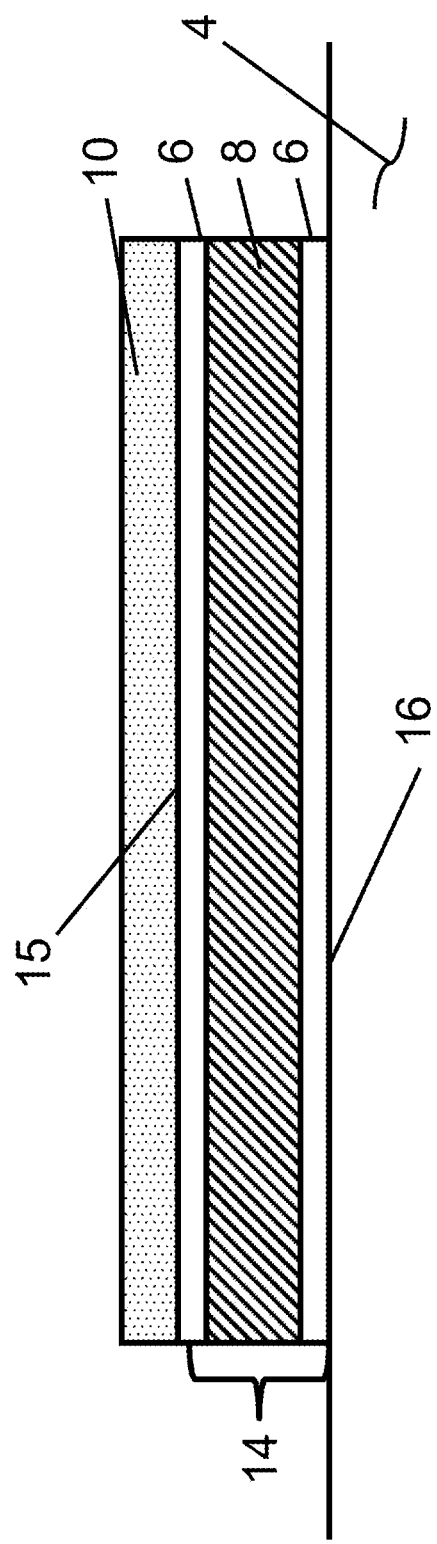
FIG. 1a depicts a cross-sectional view of an example embodiment of a metal ferroelectric semiconductor (MFS) structure including an interface layer 6 in accordance with the present invention.

The improvement potential of Nb in certain perovskite type dielectrics like PZT, STO, BTO is described in literature to reduce charge trapping at defect sites. Here, space charges associated with oxygen vacancies are generally considered as pinning centers of domains and so limit the motion of domain walls. As a consequence, the ferroelectric properties are degraded (in particular fatigue, imprint, and endurance). The improvement of the ferroelectric performances of Nb doped PZT (PNZT) films, in comparison with PZT, seems to show that the oxygen vacancy content is lower in PNZT and confirms the electrical modifications of the charges. Doping with donor cations reduces the oxygen vacancy density and thus the dipolar defect concentration. A similar improvement potential could not be shown for $HfO_2$ and $ZrO_2$ based ferroelectric materials because a complete doping of such a ferroelectric material with Nb will negatively change the ferroelectric properties of the materials.

In accordance with embodiments described herein, a ferroelectric memory cell of an integrated circuit comprises an oxide storage layer comprising a ferroelectric material including as a main component, oxygen and any one or more of Hf (hafnium) and Zr (zirconium). A Nb doped ferroelectric structure including as a main component, oxygen and any one or more of Hf (hafnium) and Zr (zirconium) containing covering layer is placed at the interface of the ferroelectric layer to the two electrodes to reduce oxygen vacancies and defects in the outside regions of the ferroelectric film. The amount of Nb within the interfacial layer can be adjusted according to the amount of trap sites. The Nb doping amount can be different at the top and bottom electrode layer interface.

The term "ferroelectric material," as used herein, refers to a material that is at least partially in a ferroelectric state and further comprises, as main components, oxygen and any of the group consisting of Hf, Zr and (Hf, Zr). For example, the ferroelectric material may comprise any of $HfO_2$, $ZrO_2$, any ratio of Hf and Zr combined with oxygen (e.g., $Zr_xHf_{1-x}O_2$, where x<1) as well as any combinations thereof. In addition, the term "main components," as used herein, refers to any suitable number of O and any one or combinations of Hf, Zr and (Hf, Zr) per volumetric content, e.g., unit cell, that is higher compared to any other components or further additives introduced in any suitable manner into a ferroelectric material oxide layer.

The electrodes can comprise any one or more suitable conductive metals including, without limitation, TiN, TaN, TaCN, WCN, Ru, Re, RuO, Pt, Ir, IrO, Ti, TiAlN, TaAlN, W, WN, C, Si, Ge, SiGe and NbCN. The electrodes can be a combination of one or more conducting layers. One of the electrodes can be part of a substrate.

A doping of the whole ferroelectric material with a five-valent dopant including as a main component, oxygen and any one or more of Hf (hafnium) and Zr (zirconium) is not preferred since the material stack will lose the ferroelectric properties. Accordingly, an introduction of a small amount of Nb at the interface to the electrode layer material is suggested to reduce the oxygen vacancy density similar to other ferroelectric materials.

There are different possibilities known to establish a certain Nb (or other five-valent dopant) amount at the interface between the ferroelectric material including as a main component, oxygen and any one or more of Hf (hafnium) and Zr (zirconium) and electrodes. One possibility is the deposition of a low $NbO_x$ amount during the initial deposition the ferroelectric material including as a main component, oxygen and any one or more of Hf (hafnium) and Zr (zirconium).

A second possibility is the deposition of a metallic Nb layer or metallic layer having Nb included before the deposition of the ferroelectric material including as a main component, oxygen and any one or more of Hf (hafnium) and Zr (zirconium). The available oxygen of the ferroelectric material including as a main component, oxygen and any one or more of Hf (hafnium) and Zr (zirconium) will partially oxidize the metallic Nb or $NbN_x$ layer to $NbO_x$. This $NbO_x$ interfacial layer would also reduce the number of trap sites within the interface of the electrode layer and dielectric material.

Another third possibility is the deposition of a very thin layer (about a monolayer) of the ferroelectric material including as a main component, oxygen and any one or more of Hf (hafnium) and Zr (zirconium) prior to the deposition of a layer of Nb, NbO$_x$ or NbN$_x$. The available oxygen of the following ferroelectric material including as a main component, oxygen and any one or more of Hf (hafnium) and Zr (zirconium) will partially oxidize the metallic Nb or NbN$_x$ layer to NbO$_x$.

All three of the above-described possibilities to deposit an Nb-doped oxide interface layer on the bottom electrode layer can also be performed at the interface between the ferroelectric material and the top electrode. Accordingly, the number of trap sites at the top electrode interfacial layer can be reduced.

The ferroelectric memory cell structure can be formed, e.g., as a metal ferroelectric semiconductor (MFS) structure (e.g., for FeFET structures) as depicted in FIG. 1a. The ferroelectric memory cell can also be formed as a metal ferroelectric metal (MFM) structure (e.g., for FeRAM structures) as depicted in the cross-sectional view of FIG. 2.

Referring to the cross-sectional view of FIG. 1a, an example embodiment of a MFS structure includes a support structure 4 comprising a carrier material, such as a silicon compound. A first oxide layer 8 is formed over layer 4 and comprises a ferroelectric material. A Nb containing interface layer 6 might be deposited on the support structure or next to the top electrode layer 10.

Figure 1B:
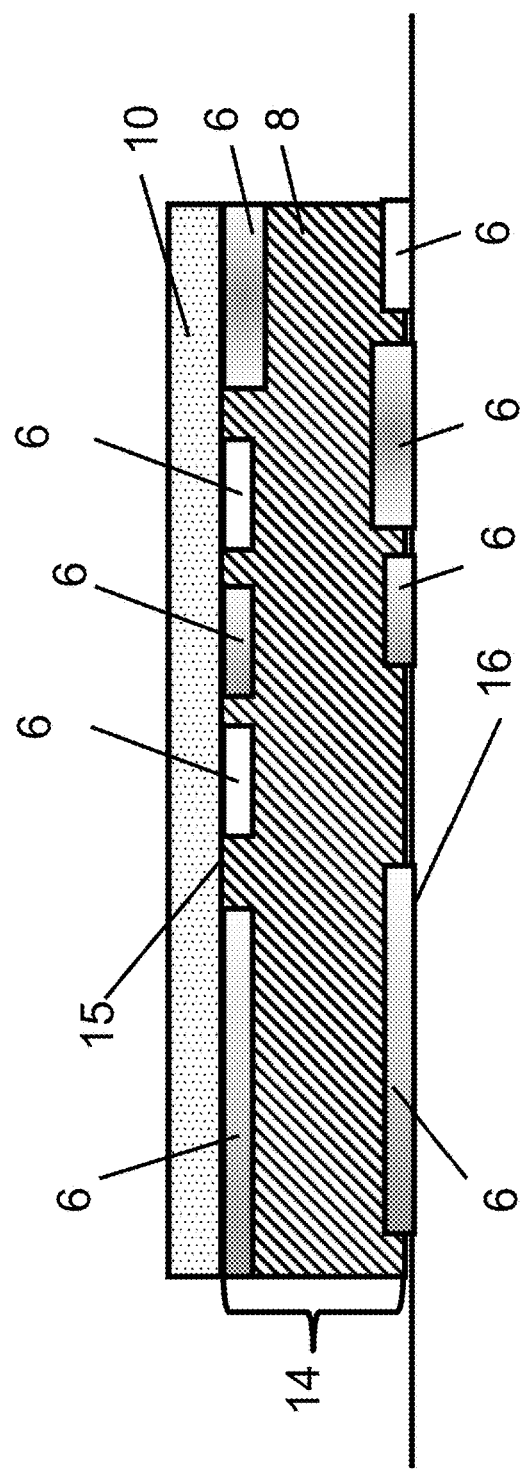
FIG. 1b depicts a cross-sectional view of an example embodiment of a metal ferroelectric semiconductor (MFS) structure including an interface layer 6 which is a sub monolayer or not closed layer in accordance with the present invention.

A detailed view of the interfacial layer is displayed in FIG. 1b. The amount of Nb doping needs to be higher than the trap concentration within the interfacial region 15. NbO$_x$ concentrations within HfO$_x$ in the interfacial layer 6 could be below 100%.

An example embodiment of a MFM structure (FIG. 2) includes the support structure 4, and a conductive layer 12 formed over the support structure 4, where the conductive layer can be formed of conductive materials such as described herein in relation to layer 10. A first Nb containing HfO$_2$ layer 6, followed by a ferroelectric material oxide layer 8, and then a second Nb containing HfO$_2$ layer 6 are disposed over the conductive layer 12. A conductive layer 10 is disposed over the second interface layer 6. Nb could be replaced by different dopants with a valence value +5.

Figure 2:
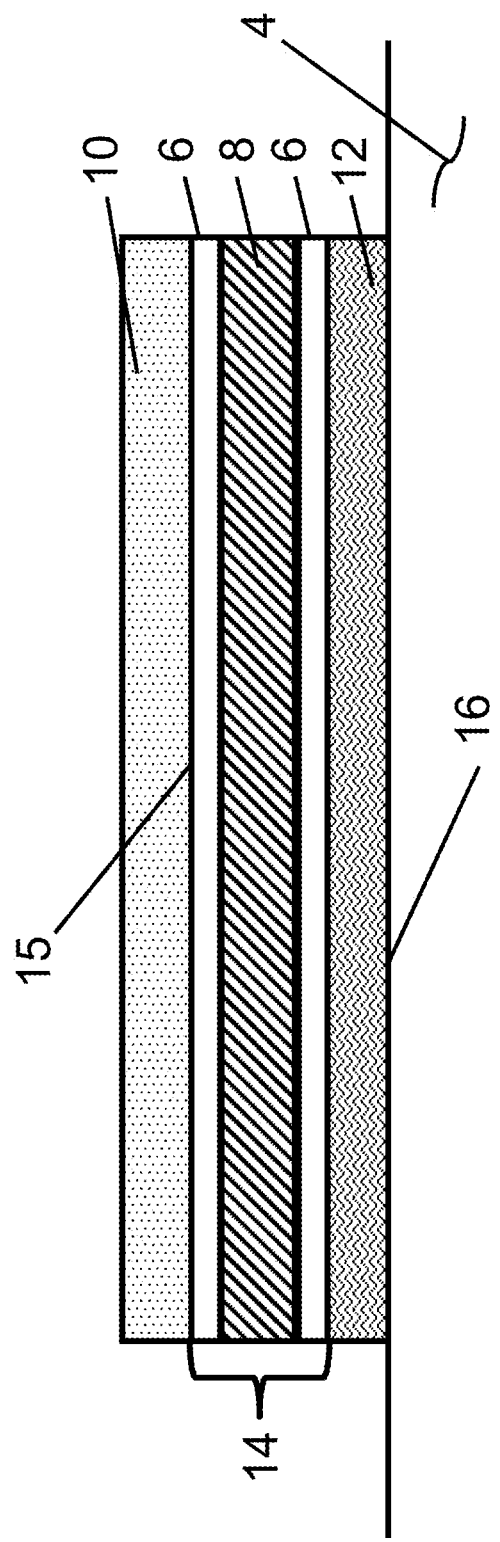
FIG. 2 depicts a cross-sectional view of an example embodiment of a metal ferroelectric metal (MFM) structure in accordance with the present invention.

An example process for forming each of the MFS and MFM structures of FIGS. 1 and 2 is described as follows. A carrier structure 4 is provided that may comprise Si (silicon), Ge (germanium) and their compounds, such as SiGe (silicon-germanium) or silicon-on-insulator (SOI). It is noted that other semiconductor materials can also be provided as the carrier structure 4 including, e.g., III-V semiconductor compounds such as GaAs or any other suitable substrate material. The carrier structure 4 may have already been processed so as to include components and/or other devices already be formed within the carrier structure.

For the MFM structure of FIG. 2, the conductive layer 12 can be deposited via any suitable process over the support structure 4. Some examples of formation processes that can be used to form conductive layers 10 and 12 include atomic layer deposition (ALD), metal organic atomic layer deposition (MOALD), chemical vapor deposition (CVD), metal organic chemical vapor deposition (MOCVD), physical vapor deposition (PVD), or any other suitable deposition technique that facilitates formation of the conductive layers utilizing one or more suitable conductive materials as previously described herein. The conductive layer 12 can be formed having a suitable thickness dimension, e.g., in the range from about 2 nm to about 5000 nm. In an example embodiment, the thickness range for conductive layer 12 can be within the range from about 2 nm to about 500 nm or in a range from about 2 nm to about 50 nm.

The ferroelectric material oxide layer 8 is formed on the interface layer 6 on the conductive layer 12 for the MFM structure 5 of FIG. 2, while the ferroelectric material oxide layer 8 is formed on the support structure 4 for the MFS structure 2 of FIG. 1. In each embodiment, layers 6 and 8 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel, dopant implantation into an oxide layer or any other suitable deposition technique that facilitates formation of the layer including the ferroelectric material as described herein (i.e., oxygen and at least one of Hf and Zr), where growth of each layer can be single-crystalline or poly-crystalline. Any suitable number and types of precursors may be utilized to introduce elements such as Hf and Zr into the layer 8 utilizing any of the deposition techniques as described herein. The layer 8 is formed to have a suitable thickness, e.g., in the range from about 2 nm to about 5000 nm. In an example embodiment, the thickness range for layer 6 can be within the range from about 2 nm to about 500 nm or in a range from about 2 nm to about 50 nm.

An interface layer 6 is provided between the ferroelectric material oxide layer 8 and conductive layer 10. The interface layer can be deposited prior to or right after forming the conductive layer 10 utilizing any suitable deposition process such as any of the previously described processes, and the further interface layer can comprise any suitable materials such as Ta$_x$O$_y$, Nb$_x$O$_y$, and V$_x$O$_y$. The further interface layer may also be formed in a same deposition process with the ferroelectric material oxide layer 8 by changing the supply of source/precursor materials during the deposition process (thus allowing the deposition to be performed within the same deposition chamber). For example, when forming the ferroelectric material oxide layer 8 from HfO$_2$, a precursor gas including oxygen may be continuously provided during deposition of the interface layer. Hafnium precursor gas may be included with the oxygen precursor gas first in the deposition chamber to form the layer 8, where the hafnium precursor gas flow is then switched to a precursor gas flow (e.g., Nb) to with the continuing flow of oxygen to form the further interface layer (e.g., Nb$_x$O$_y$). The bottom and top interface layers 6 can include the same or a different number, types and/or concentrations of additives.

In addition, the ferroelectric material oxide layers 8 can be formed to include, in addition to the ferroelectric material, dopants or further additives that may support the crystallization of the layer 8 into a state having ferroelectric properties. The additives can be included with the precursor materials, e.g., so as to be included during formation of the layer 8. Alternatively, the additives can be introduced into the formed layer 8 by ion implantation or any other suitable process. A concentration of the further additives within the layer may be set within a range from about 0.05 at % (atomic percent, as measured by ratio of additive atoms to ferroelectric material atoms) to about 40 at %, within a range from about 0.05 at % to about 15 at %, within a range from about 0.05 at % to about 10 at %, within a range from about 0.5 at % to about 5 at %, or a range from about 1 at % to about 3.5 at %. In general, the amount of the further additives may depend on the thickness of the layer 8. When increasing the thickness of the layer 8, the concentration of the further additives may also have to be increased to achieve a desired crystallization having ferroelectric properties.

Any suitable additives may be provided within the ferroelectric material oxide layer 8 including, without limitation, any one or more of C, N, Si, Al, Ge, Sn, Sr, Pb, Mg, Ca, Sr, Ba, Ti, Zr (e.g., providing Zr as an additive in a HfO2 layer), Ti, and any one or more of the rare earth elements (e.g., Y, Gd, La, etc.). In particular, it has been determined that certain additives having an atomic radius that is about the same as or greater than Hf are particularly suitable as dopants for optimizing ferroelectric (FE) properties of the ferroelectric material oxide layer 8 when utilizing Hf in the layer. In contrast, certain additives having an atomic radius smaller than Hf can cause anti-ferroelectric (anti-FE) properties at phase boundaries between the monoclinic and tetragonal/cubic phases of $HfO_2$. It has further been determined that additives having an atomic radius about the same as or greater than Hf can be doped at larger ranges of concentrations within the ferroelectric material oxide layer in relation to other additives while still supporting FE properties of the ferroelectric material oxide layer. Other additives having the same valence as Hf (e.g., Si, Ge, Zr) can also be beneficial as dopants to reduce charge trapping characteristics of the ferroelectric material oxide layer by reducing open bonds within the $HfO_2$ host lattice of the layer.

Figure 3:
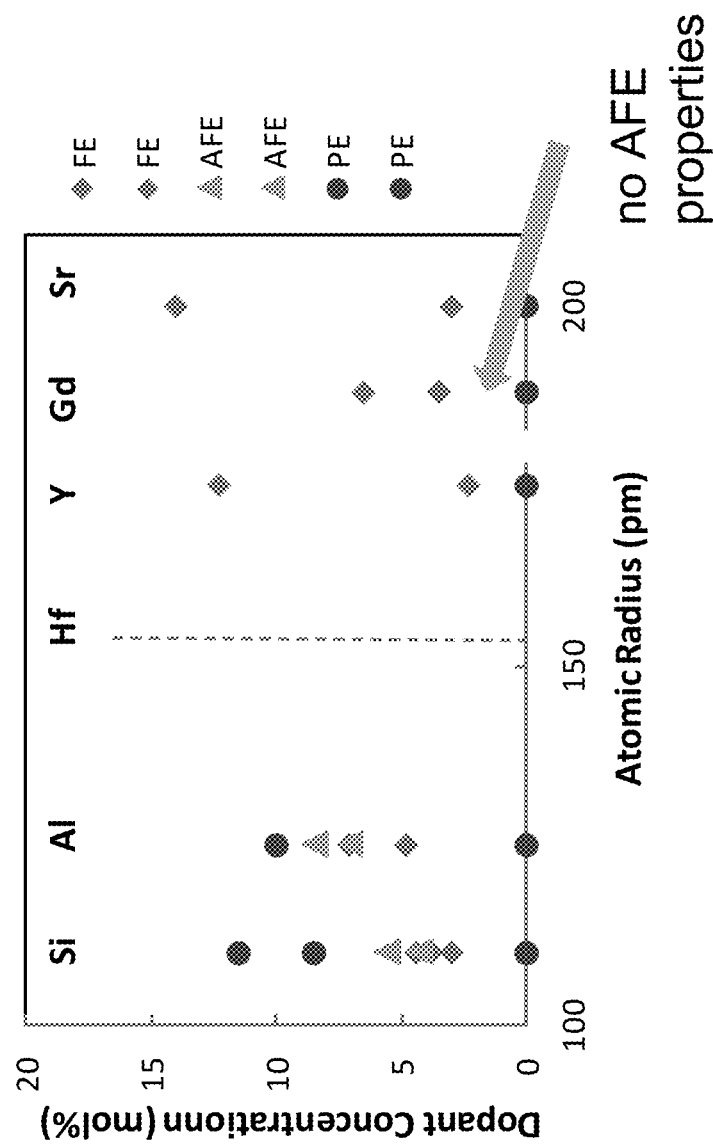
FIG. 3 is a plot of atomic radius vs. dopant concentration for elements having radii both greater and smaller than hafnium, and further showing ferroelectric, anti-ferroelectric and paraelectric properties of ferroelectric material oxide layers formed with these elements at the different concentrations within the layers.

An example of a plot showing elements and their atomic radii in relation to Hf is depicted in the plot of FIG. 3 to show the effectiveness of such elements as dopants in a ferroelectric material oxide layer. In particular, the atomic radius (pm) of each element vs. dopant concentration (at %) for each element is shown at data points indicating the properties of the formed ferroelectric material oxide layer resulting from such doping: FE (ferroelectric), AFE (anti-ferroelectric) and PE (paraelectric). As indicated by the data plotted in FIG. 3, elements such as Y, Gd, La and Sr (each of which has a greater atomic radius than Hf) can be doped in the ferroelectric material oxide layer at a broad range of dopant concentrations (e.g., 1 at % to 14 at % or greater) resulting in the ferroelectric material oxide layer exhibiting FE properties and no AFE properties. In contrast, elements such as Si and Al (each having an atomic radius less than Hf) provide a much smaller dopant concentration range in which the oxide storage layer can both exhibit ferroelectric as well as antiferroelectric properties.

The conductive layer 10 for each of the embodiments of FIGS. 1 and 2 is formed over the combined ferroelectric material oxide layer 14, e.g., in the same or similar manner as previously described in relation to conductive layer 12. The conductive layer can also be formed from any of the types of conductive materials as previously described for conductive layer 12, and the thickness of conductive layer 10 can be within the same range or ranges as previously noted for conductive layer 12. The conductive layers 10 and 12 for the MFM embodiment of FIG. 2 can have the same or different thicknesses.

The conductive layer 10 for the embodiments of FIGS. 1 and 2 provides a covering layer for the combined ferroelectric material oxide layer 14 and can also serve as an electrode layer (e.g., gate electrode) for the implementation of the MFS or MFM within a semiconductor memory cell structure.

In an alternative embodiment, the two conducting layer have different workfunction values.

After the layers have been formed, an anneal process is carried out for the structure of FIG. 1 and the structure of FIG. 2 at one or more suitable temperatures and for one or more suitable time periods to achieve a suitable amount of crystallization for the ferroelectric material within the combined ferroelectric material oxide layer 14. In particular, the anneal process is carried out to heat the combined ferroelectric material oxide layer 14 to a temperature that is above the crystallization temperature of the ferroelectric material so as to at least partially alter its crystal state from amorphous to crystalline, thus resulting in a crystallized oxide within the ferroelectric material oxide layers 8. A crystallization temperature may be chosen in a range of, e.g., from about 400° C. to about 1200° C. depending on the thermal budget of the used devices. A preferred crystalline temperature for the annealing process is at a temperature that is above the onset of crystallization for the ferroelectric material (when the ferroelectric material is amorphous, i.e., after the layer 8 is deposited and before annealing occurs) and is further greater than about 500° C., or at a temperature that is above the onset of crystallization for the ferroelectric material and is further greater than about 300° C. The time period for annealing can be from about 0.01 second to about 12 hours. These annealing temperature ranges induces partial crystallization of the ferroelectric material oxide layers 8 (e.g., crystallization to a suitable level within the layers 8 that is less than complete crystallization of the ferroelectric material) while keeping diffusion of dopants within the layers to a minimum.

Annealing will lead to the formation of the five-valent material doped interfacial layer 6 between electrodes and the $HfO_2$ or $ZrO_2$ based ferroelectric material with improved number of trap sites.

The partial crystallization of the ferroelectric material oxide layers 8 results in ferroelectric domains within the layers 8 that are in a ferroelectric state (e.g., at least partially). The crystallized layers 8 may exhibit different dipole moments and may thus affect the conductivity throughout the combined ferroelectric material oxide layer 14. The orientation of the dipole moments in the crystallized layers 8 can be adjusted with the help of the external voltage. In this way, the dipole orientation of the partially ferroelectric material oxide layer 14 may be utilized for storage of an information state. For example, as described below, the MFS structure can be used to form a FeFET, where the channel conductivity in the FeFET depends upon the dipole orientation of the combined ferroelectric material oxide layer 14 of the MFS structure. In another embodiment, the MFM structure can be utilized to form a capacitor dielectric of a 1T-1C FeRAM. Here the dipole orientation of the combined ferroelectric material oxide layer 14 determines the transient current and voltage level on the bit line during read operation (the bit line is connected to the capacitor structure).

The various layers 6, 8, 10 and/or 12 of the structures depicted in FIGS. 1 and 2 can be patterned at any time after formation of the layers, either before or after the annealing process to partially crystallize the combined ferroelectric material oxide layer 14. The patterning of these layers may be carried out by an etch process using an etch mask (e.g., a hard mask), where the patterning of the layers can be carried out based upon the intended use of these layers. For example, the layers may be patterned to define at least part of a gate stack of a 1T FeFET or these layers may be patterned to define a capacitor dielectric of 1T-1C FeRAM. Any suitable spacer structures may also be formed (e.g., utilizing any suitable deposition technique, such as any of the deposition techniques previously described herein) after patterning the layers. Any other further processing of the carrier or support structure to integrate other components in relation to the support structure can be implemented before, after or together with the formation of the MFS structure or MFM structure. For example, source/drain regions of the ferroelectric memory cells may be formed before, after or together with the ferroelectric layer.

Figure 4:
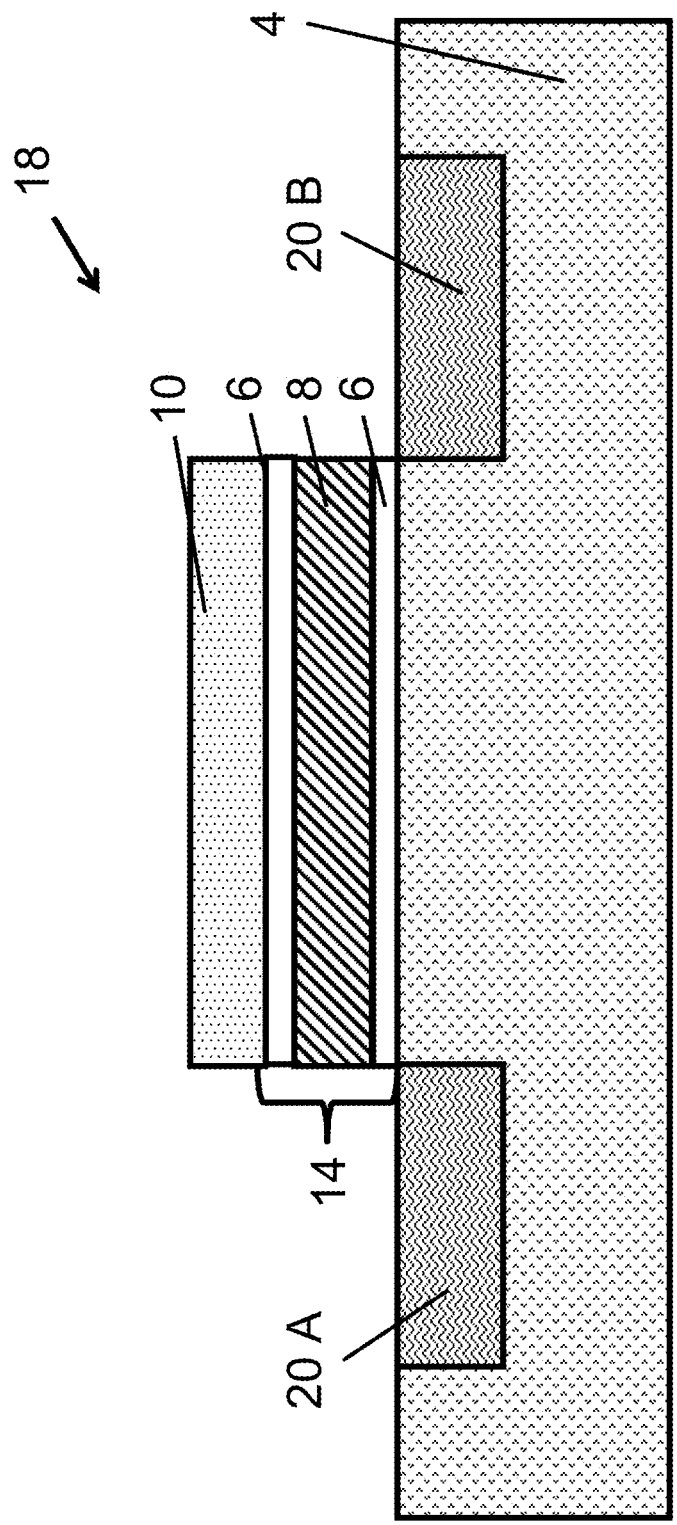
FIG. 4 depicts a cross-sectional view of an example embodiment of an integrated circuit including a planar 1T ferroelectric memory cell including the metal ferroelectric semiconductor (MFS) structure of FIG. 1.
Figure 5:
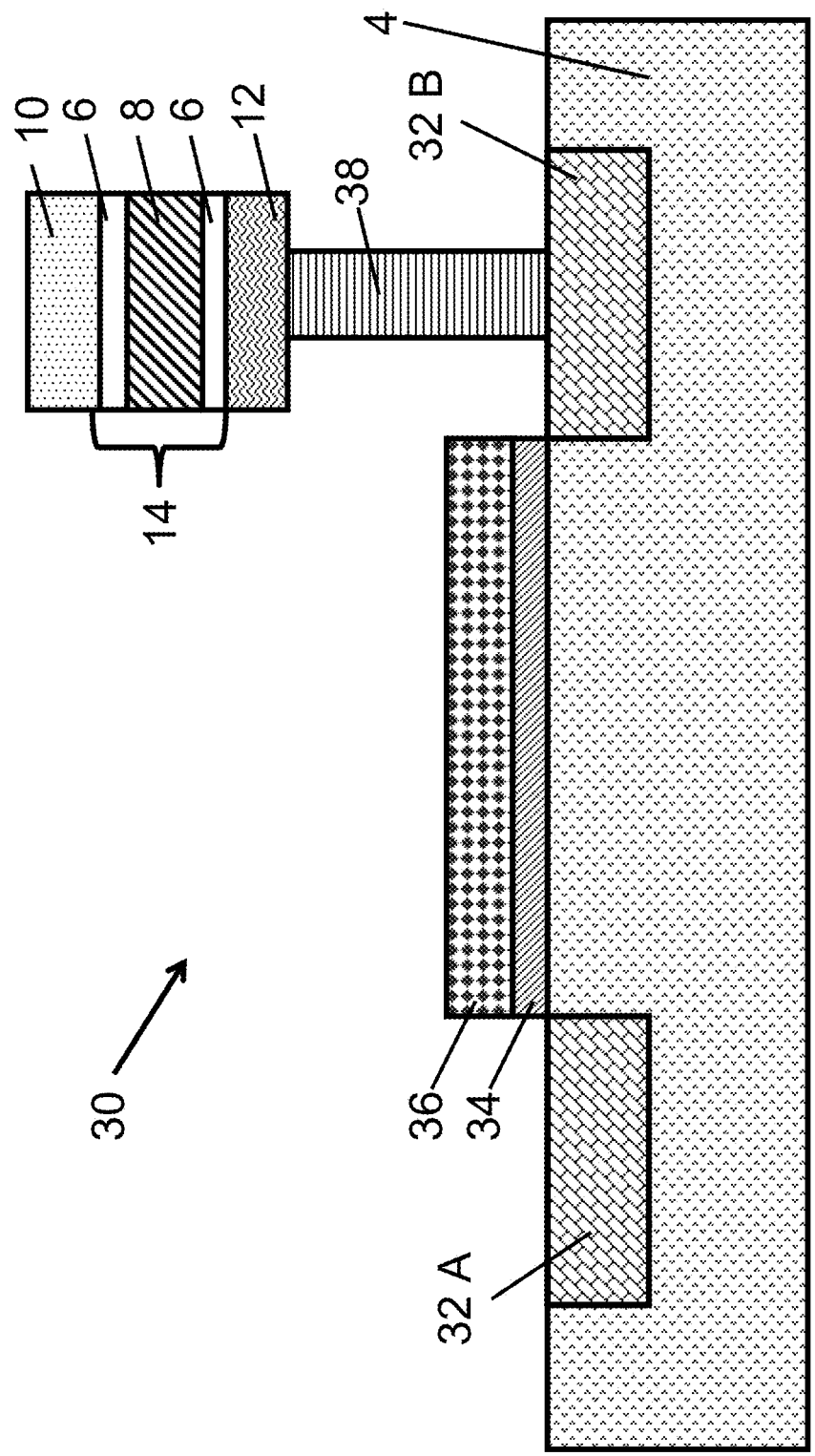
FIG. 5 depicts a cross-sectional view of an example embodiment of an integrated circuit including a planer 1T-1C ferroelectric memory cell including the metal ferroelectric metal (MFM) structure of FIG. 2.

An example embodiment that integrates an MFS structure 2 such as depicted in FIG. 1 in a FeFET memory cell 18 is depicted in the cross-sectional view of FIG. 4. In this embodiment, a planar 1T FeFET comprises the support structure 4 with the MFS structure 2 formed thereon and source/drain regions 20A, 20B formed within the structure 4. The MFS structure 2 is integrated within the FeFET memory cell 18 as a gate layer stack, where conductive layer 10 comprises a gate electrode. In an alternative embodiment, an insulating buffer layer can be formed between the combined ferroelectric oxide layer 14 and the surface of the support structure 4. The insulating buffer layer can be formed of any suitable materials including, without limitation, SiO2 or SiON. It is to be understood that the schematic cross-sectional view of the FeFET memory cell 18 forms a part of an integrated circuit. For example, an integrated circuit may comprise a plurality of FeFET memory cells 18 arranged in the form of a ferroelectric memory cell array. Additional circuits may also be formed in the support structure 4. By way of example, these additional circuits may include word line drive circuits, bit line drive circuits, source line drive circuits, sense circuits, control circuits, and any other suitable circuits for the integrated circuit. In general, any semiconductor devices, e.g., diodes, bipolar transistors, diffusion resistors, silicon controlled rectifiers (SCR), field effect transistors (FET), may be formed within the support structure 4. In addition, a wiring area including a stack of conductive layers, e.g., metal layers, and intermediate dielectrics may be formed over portions of the support structure 4, where the wiring area may be used to interconnect semiconductor devices or circuit parts of the integrated circuit.

It is further noted that the MFS structure can also be formed with any one or more suitable geometries including, without limitation, planar or 3D geometry such as Trench MOSFET, FinFET, RCAT ("Recessed Channel Array Transistor"), TSNWFET ("Twin Silicon NanoWire Field Effect Transistor"), PiFET ("Partially insulated Field Effect Transistor"), McFET ("Multi-channel Field Effect Transistor"), NCFET ("Negative Capacitance Field Effect Transistor"), FTJ ("Ferroelectric Tunnel Junction") including geometries and with different combinations of layers as described in U.S. Pat. No. 8,304,823, the disclosure of which is incorporated herein by reference in its entirety.

While the example embodiments described herein are in relation to 1T ferroelectric memory cells (FeFETs) and 1T-1C ferroelectric memory cells, the present invention is not limited to such memory cells but instead can be applied to any suitable type of ferroelectric memory cell (e.g., 2T-2C memory cells).

Since the presence of the ferroelectric properties can be accompanied by the presence of a negative capacity effect, a Negative Capacitance Field Effect Transistor can be formed by using a FeFET device. The interfacial layer will prevent charge trapping, having a positive effect on the steep slope behavior. In addition, if the interface layer is an oxide layer, its dielectric behavior can contribute to stabilize the ferroelectric effect needed to preserve the negative capacity effect.

Since the presence of the ferroelectric properties is necessarily accompanied by the presence of piezoelectric properties, a ferroelectric memory cell or a piezo element can be formed by using an MFM capacitor. Applying a certain voltage to the device will cause a piezoelectric expansion of the device which can be used for different applications where piezo-elements are included in a device to cause a transformation of an input signal (mainly an electrical signal) into motion or to prevent a motion. The main advantage of a $HfO_2$-based piezo element is that the material is lead free.

Since the presence of the ferroelectric properties is necessarily accompanied by the presence of pyroelectric properties, a ferroelectric memory cell or a pyro element can be formed by using an MFM capacitor. Applying a heat change to the device will cause a pyroelectric current in the device, which can be used for different applications where pyro-elements are included in a device to cause a transformation of a temperature change into electric current (or vice versa). The main advantage of an $HfO_2$-based pyro-element is that the material is lead free.

The embodiments described herein enhance the performance of a ferroelectric memory cell and avoid the possibility of errors during read/write operations associated with the memory cell. In particular, the five valent material doped interlayer layer at the interface between the electrodes and the ferroelectric material layer reduces the amount of trap sites and with this the leakage current that may otherwise occur via the trap sites of the ferroelectric structure and further increases the cycling endurance and the lifetime of the structure, thus rendering the memory cell more reliable.

What is claimed is:

1. An integrated circuit comprising a ferroelectric memory cell, the ferroelectric memory cell comprising:
an oxide storage layer comprising a ferroelectric material that is at least partially in a ferroelectric state, the ferroelectric material comprising one or more components selected from the group consisting of (Hf, O), (Zr, O), and (Hf, Zr, O), wherein the one or more components are present in an amount higher per unit cell than any other components or additives present in the oxide storage layer;
an electrode layer; and
an oxygen vacancy density reduction layer disposed between the oxide storage layer and the electrode layer, wherein the oxygen vacancy density reduction layer comprises at least one element with a higher valence value than Hf(4+) or Zr(4+).

2. The integrated circuit of claim 1, wherein the oxygen vacancy density reduction layer is an oxide layer comprising, as main components, oxygen and any of the group consisting of Hf, Zr, (Hf, Zr) and the at least one element with a higher valence value than Hf(4+) or Zr(4+).

3. The integrated circuit of claim 2, wherein the at least one element is a five-valent dopant.

4. The integrated circuit of claim 3, wherein the at least one element is any of the group consisting of Nb, Ta, and V.

5. The integrated circuit of claim 1, wherein the oxygen vacancy density reduction layer is a metallic layer comprising the at least one element with a higher valence value than Hf(4+) or Zr(4+).

6. The integrated circuit of claim 5, wherein the at least one element is a five-valent element.

7. The integrated circuit of claim 6, wherein the at least one element is any of the group consisting of Nb, Ta, and V.

8. The integrated circuit of claim 1, wherein the electrode layer comprises a gate electrode of a transistor.

9. The integrated circuit of claim 1, wherein the ferroelectric memory cell comprises a FeFET including the oxide storage layer, the electrode layer, and the oxygen vacancy density reduction layer.

10. The integrated circuit of claim 1, wherein the ferroelectric memory cell includes a storage capacitor comprising the oxide storage layer, the electrode layer, and the oxygen vacancy density reduction layer.

11. The integrated circuit of claim 1, wherein the ferroelectric memory cell comprises a FeRAM including the oxide storage layer, the electrode layer, and the oxygen vacancy density reduction layer.

12. The integrated circuit of claim 1, wherein the ferroelectric memory cell further comprises a second interface layer disposed on a side of the oxide storage layer that is opposite from a side of the oxide storage layer on which the oxygen vacancy density reduction layer is disposed, wherein the second interface layer comprises at least one element with a higher valence value than Hf(4+) or Zr(4+).

13. The integrated circuit of claim 1, wherein the second interface layer is an oxide layer comprising, as main components, oxygen and any of the group consisting of Hf, Zr, (Hf, Zr) and the at least one element with a higher valence value than Hf(4+) or Zr(4+).

14. The integrated circuit of claim 1, wherein the second interface layer is a metallic layer comprising at least one element with a higher valence value than Hf(4+) or Zr(4+).

15. The integrated circuit of claim 1, wherein the at least one element of the second interface layer is a five-valent dopant.

16. The integrated circuit of claim 1, wherein the at least one element of the second interface layer is any of the group consisting of Nb, Ta, and V.

17. The integrated circuit of claim 1, further comprising a semiconductor substrate, the second interface layer being disposed between the oxide storage layer and the semiconductor substrate.

18. The integrated circuit of claim 12, wherein the ferroelectric memory cell comprises a FeFET including the oxide storage layer, the electrode layer, the oxygen vacancy density reduction layer, and the second interface layer.

19. The integrated circuit of claim 1, wherein the ferroelectric memory cell further comprises a second electrode layer, the second interface layer being disposed between the oxide storage layer and the second electrode layer.

20. The integrated circuit of claim 1, wherein the ferroelectric memory cell includes a storage capacitor comprising the oxide storage layer, the electrode layer, a second electrode layer, the oxygen vacancy density reduction layer, and the second interface layer.

21. The integrated circuit of claim 1, wherein the oxygen vacancy density reduction layer further comprises as main components oxygen and the at least one element with a higher valence value than Hf(4+) or Zr (4+).

* * * * *

UNITED STATES PATENT AND TRADEMARK OFFICE
CERTIFICATE OF CORRECTION

PATENT NO. : 10,600,808 B2
APPLICATION NO. : 15/695533
DATED : March 24, 2020
INVENTOR(S) : Uwe Schröder It is certified that error appears in the above-identified patent and that said Letters Patent is hereby corrected as shown below:

In the Claims

Claim 13, Column 11, Line 11, replace "The integrated circuit of claim 1," with --The integrated circuit of claim 12,--

Claim 14, Column 11, Line 16, replace "The integrated circuit of claim 1," with --The integrated circuit of claim 12,--

Claim 15, Column 11, Line 19, replace "The integrated circuit of claim 1," with --The integrated circuit of claim 12,--

Claim 16, Column 11, Line 22, replace "The integrated circuit of claim 1," with --The integrated circuit of claim 12,--

Claim 17, Column 12, Line 1, replace "The integrated circuit of claim 1," with --The integrated circuit of claim 12,--

Claim 19, Column 12, Line 10, replace "The integrated circuit of claim 1," with --The integrated circuit of claim 12,--

Claim 20, Column 12, Line 14, replace "The integrated circuit of claim 1," with --The integrated circuit of claim 12,--

Signed and Sealed this
Twenty-ninth Day of August, 2023

Katherine Kelly Vidal
*Director of the United States Patent and Trademark Office*